(12) United States Patent
Bauer

(10) Patent No.: US 12,196,785 B2
(45) Date of Patent: Jan. 14, 2025

(54) ELECTRICAL SENSOR ASSEMBLY

(71) Applicant: G & W Electric Company, Bolingbrook, IL (US)

(72) Inventor: Alberto Bauer, Dubai (AE)

(73) Assignee: G & W Electric Company, Bolingbrook, IL (US)

( * ) Notice: Subject to any disclaimer, the term of this patent is extended or adjusted under 35 U.S.C. 154(b) by 0 days.

(21) Appl. No.: 18/313,799

(22) Filed: May 8, 2023

(65) Prior Publication Data

US 2023/0273242 A1 Aug. 31, 2023

Related U.S. Application Data

(63) Continuation of application No. 17/664,585, filed on May 23, 2022, now Pat. No. 11,644,484, which is a
(Continued)

(30) Foreign Application Priority Data

Dec. 17, 2018 (IT) .......................... 102018000011146
Dec. 17, 2018 (IT) .......................... 202018000003942

(51) Int. Cl.
*G01R 15/16* (2006.01)
*G01R 19/00* (2006.01)

(52) U.S. Cl.
CPC ....... *G01R 15/165* (2013.01); *G01R 19/0084* (2013.01); *G01R 15/16* (2013.01); *G01R 19/0092* (2013.01)

(58) Field of Classification Search
CPC ........ G01R 15/00; G01R 15/14; G01R 15/16; G01R 15/165; G01R 19/00; G01R 19/0084; G01R 19/0092; G01R 29/00; G01R 29/12
(Continued)

(56) References Cited

U.S. PATENT DOCUMENTS 3,396,339 A 8/1968 Miram
3,835,353 A 9/1974 Hermstein et al.
(Continued)

FOREIGN PATENT DOCUMENTS

CN 104160283 A 11/2014
CN 105588966 A 5/2016
(Continued)

OTHER PUBLICATIONS

International Preliminary Report on Patentability for Application No. PCT/IT2019/000023 dated Oct. 15, 2020 (7 pages).
(Continued)

*Primary Examiner* — Hoai-An D. Nguyen
(74) *Attorney, Agent, or Firm* — Michael Best & Friedrich LLP

(57) ABSTRACT

A sensor assembly includes an electrode extending along a longitudinal axis and a tubular section extending along the longitudinal axis and at least partially surrounding the electrode such that the tubular section is radially spaced from the electrode, the tubular section including a first layer made of an electrically insulating material and having a first length, a second layer made of an electrically conductive material disposed on an inner surface of the first layer and having a second length, and a third layer made of an of electrically conductive material disposed on an outer surface of the first layer and having a third length. The sensor assembly also includes a mass of dielectric material at least partially enclosing the electrode and the tubular section. The mass of dielectric insulating material fills through openings in the tubular section, and the second length and the third length are coextensive.

21 Claims, 10 Drawing Sheets

Related U.S. Application Data continuation of application No. 17/414,887, filed as application No. PCT/US2019/066899 on Dec. 17, 2019, now Pat. No. 11,340,266.

(58) Field of Classification Search
USPC .............................. 324/76.11, 126, 127, 530
See application file for complete search history.

(56) References Cited

U.S. PATENT DOCUMENTS

| | | |
|---|---|---|
| 4,241,373 A | 12/1980 | Mara et al. |
| 4,268,889 A | 5/1981 | Wolfendale |
| 4,700,123 A | 10/1987 | Beling |
| 5,136,241 A | 8/1992 | Blank et al. |
| 5,661,240 A | 8/1997 | Kemp |
| 5,991,177 A | 11/1999 | Kaczkowski |
| 6,252,388 B1 | 6/2001 | Jaeger et al. |
| 6,307,385 B1 | 10/2001 | Tardif et al. |
| 6,396,264 B1 | 5/2002 | Tamaki et al. |
| 7,466,146 B2 | 12/2008 | Stewart et al. |
| 7,541,816 B1 | 6/2009 | Liao et al. |
| 7,595,648 B2 | 9/2009 | Ungaretti et al. |
| 8,242,840 B2 | 8/2012 | Van Veldhoven |
| 8,283,934 B2 | 10/2012 | Nishizono |
| 8,294,477 B2 | 10/2012 | Handshoe et al. |
| 8,446,157 B2 | 5/2013 | Fröjd |
| 8,847,353 B2 | 9/2014 | Hasunuma |
| 9,118,330 B2 | 8/2015 | Beyly et al. |
| 9,291,651 B2 | 3/2016 | Bauer |
| 9,389,246 B2 | 7/2016 | Juds et al. |
| 9,568,506 B2 | 2/2017 | Fujinoki |
| 9,696,348 B2 | 7/2017 | Juds et al. |
| 9,739,805 B2 * | 8/2017 | Gravermann .......... G01R 31/58 |
| 9,739,807 B2 | 8/2017 | Barba Jimenez |
| 9,739,816 B2 | 8/2017 | Flanagan |
| 9,739,820 B2 | 8/2017 | Gravermann et al. |
| 9,742,180 B2 | 8/2017 | Wentzel et al. |
| 9,846,024 B1 | 12/2017 | Noras |
| 9,921,246 B2 | 3/2018 | Bauer |
| 9,927,415 B2 | 3/2018 | Baumann et al. |
| 9,958,505 B2 | 5/2018 | Honda |
| 9,983,032 B1 | 5/2018 | Kraver et al. |
| 10,025,423 B2 | 7/2018 | Aas et al. |
| 10,088,963 B2 | 10/2018 | Otagaki et al. |
| 10,203,814 B2 | 2/2019 | Ryynanen et al. |
| 10,215,778 B2 | 2/2019 | Gravermann et al. |
| 10,317,442 B2 | 6/2019 | Kawaguchi et al. |
| 10,338,103 B2 | 7/2019 | Gravermann et al. |
| 10,345,340 B2 | 7/2019 | Gravermann et al. |
| 10,425,079 B1 | 9/2019 | Bytheway |
| 10,591,523 B2 | 3/2020 | Pak et al. |
| 10,753,962 B2 | 8/2020 | Testa et al. |
| 10,790,822 B2 | 9/2020 | Wendt et al. |
| 10,852,324 B2 * | 12/2020 | Peretto ................. G01R 16/165 |
| 11,048,367 B2 | 6/2021 | Reynolds et al. |
| 11,079,410 B2 | 8/2021 | Bauer et al. |
| 11,287,456 B2 | 3/2022 | Wang et al. |
| 11,346,876 B2 | 5/2022 | Bauer |
| 11,378,594 B2 | 7/2022 | Djogo |
| 11,415,611 B2 | 8/2022 | Zhang et al. |
| 11,543,436 B2 * | 1/2023 | Bauer .................... G01R 15/16 |
| 2001/0048308 A1 | 12/2001 | Potter et al. |
| 2002/0113596 A1 | 8/2002 | Horie et al. |
| 2005/0122118 A1 | 6/2005 | Zank et al. |
| 2006/0033508 A1 | 2/2006 | Lee |
| 2006/0119369 A1 | 6/2006 | Kawahata et al. |
| 2006/0238233 A1 | 10/2006 | Kraus |
| 2007/0086130 A1 | 4/2007 | Sorensen |
| 2008/0011093 A1 | 1/2008 | Shank et al. |
| 2010/0107775 A1 | 5/2010 | Wang et al. |
| 2010/0283487 A1 | 11/2010 | Juds et al. |
| 2010/0318306 A1 | 12/2010 | Tierney et al. |
| 2011/0012623 A1 | 1/2011 | Gastel et al. |
| 2011/0121820 A1 | 5/2011 | Handshoe et al. |
| 2011/0121842 A1 | 5/2011 | Bauer et al. |
| 2011/0204879 A1 | 8/2011 | Peretto |
| 2011/0205683 A1 | 8/2011 | Peretto |
| 2011/0221452 A1 | 9/2011 | Shyue |
| 2011/0234311 A1 | 9/2011 | Hirashiki et al. |
| 2011/0298454 A1 | 12/2011 | Ausserlechner |
| 2012/0261384 A1 | 10/2012 | Labianco et al. |
| 2012/0326734 A1 | 12/2012 | Cho et al. |
| 2013/0043891 A1 | 2/2013 | Handshoe et al. |
| 2013/0127675 A1 | 5/2013 | Mallat et al. |
| 2014/0300374 A1 | 10/2014 | Mckenzie et al. |
| 2014/0354302 A1 | 12/2014 | Lu et al. |
| 2014/0370741 A1 | 12/2014 | Bolcato et al. |
| 2015/0279642 A1 | 10/2015 | Prance |
| 2015/0346907 A1 | 12/2015 | Nakajima et al. |
| 2016/0005511 A1 | 1/2016 | Gravermann et al. |
| 2016/0061864 A1 | 3/2016 | White et al. |
| 2016/0103174 A1 | 4/2016 | Aaltonen et al. |
| 2016/0139181 A1 | 5/2016 | Gravermann et al. |
| 2016/0202286 A1 | 7/2016 | Aaltonen et al. |
| 2017/0030946 A1 | 2/2017 | Gravermann et al. |
| 2017/0038414 A1 | 2/2017 | Barba Jimenez |
| 2017/0061187 A1 | 3/2017 | Wen |
| 2017/0067938 A1 | 3/2017 | Kasai |
| 2017/0067939 A1 | 3/2017 | Imai et al. |
| 2017/0097382 A1 | 4/2017 | Bickford et al. |
| 2017/0184634 A1 | 6/2017 | Wentzel |
| 2017/0234908 A1 | 8/2017 | Gravermann et al. |
| 2017/0248731 A1 | 8/2017 | Bhongale et al. |
| 2017/0250499 A1 | 8/2017 | Sica et al. |
| 2017/0276723 A1 | 9/2017 | Buffa et al. |
| 2017/0363660 A1 | 12/2017 | Gravermann |
| 2018/0092557 A1 | 4/2018 | Bickford et al. |
| 2018/0100878 A1 | 4/2018 | Pearce et al. |
| 2018/0292435 A1 | 10/2018 | Wentzel et al. |
| 2018/0307314 A1 | 10/2018 | Connor |
| 2018/0374644 A1 | 12/2018 | Stollwerck et al. |
| 2019/0146006 A1 | 5/2019 | Sanchez Ruiz et al. |
| 2019/0181860 A1 | 6/2019 | Cholasta |
| 2019/0234995 A1 | 8/2019 | Peretto |
| 2019/0237260 A1 | 8/2019 | Stollwerck et al. |
| 2019/0324073 A1 | 10/2019 | Mikami |
| 2020/0064376 A1 | 2/2020 | Loyd et al. |
| 2020/0124642 A1 | 4/2020 | Djogo |
| 2020/0158762 A1 | 5/2020 | Wilson et al. |
| 2020/0200936 A1 | 6/2020 | Kruger |
| 2020/0256896 A1 | 8/2020 | Bauer et al. |
| 2021/0018537 A1 | 1/2021 | Bauer |
| 2021/0072289 A1 | 3/2021 | Peretto et al. |
| 2021/0206418 A1 | 7/2021 | Nakano et al. |
| 2021/0302478 A1 | 9/2021 | Kapoor et al. |
| 2021/0356499 A1 | 11/2021 | Ferraro et al. |
| 2021/0359533 A1 | 11/2021 | Hatano |
| 2022/0043033 A1 | 2/2022 | Bauer |
| 2022/0065910 A1 | 3/2022 | Ellis, Jr. et al. |
| 2022/0123748 A1 | 4/2022 | Willis et al. |
| 2022/0311441 A1 | 9/2022 | Liu |
| 2022/0317158 A1 | 10/2022 | Stollwerck et al. |

FOREIGN PATENT DOCUMENTS

| | | | |
|---|---|---|---|
| CN | 105738940 A * | 7/2016 | ........... G01T 1/2921 |
| CN | 107636477 A | 1/2018 | |
| CN | 105467187 B | 5/2018 | |
| DE | 2149881 A1 | 2/1973 | |
| DE | 19613688 A1 | 10/1997 | |
| DE | 102017000723 A1 | 8/2018 | |
| EP | 0677747 A2 | 10/1995 | |
| EP | 0912902 A1 | 5/1999 | |
| EP | 2366108 B1 | 8/2012 | |
| EP | 2993480 A1 | 3/2016 | |
| EP | 3513202 A1 | 7/2019 | |
| EP | 3828553 A1 | 6/2021 | |
| EP | 3840135 A1 | 6/2021 | |
| EP | 3862760 A1 | 8/2021 | |
| EP | 3913379 A1 | 11/2021 | |
| EP | 3881085 A4 | 7/2022 | |
| EP | 4058815 A1 | 9/2022 | |
| ES | 2221551 A1 | 12/2004 | |
| GB | 967853 A | 8/1964 | |

(56) References Cited

FOREIGN PATENT DOCUMENTS

| | | |
|---|---|---|
| GB | 2203557 A | 10/1988 |
| WO | 2009153824 A1 | 12/2009 |
| WO | 2010070693 A1 | 6/2010 |
| WO | 2011033548 A1 | 3/2011 |
| WO | 2011125725 A1 | 10/2011 |
| WO | 2011157047 A8 | 1/2013 |
| WO | 2013026423 A1 | 2/2013 |
| WO | 2013042155 A2 | 3/2013 |
| WO | 2015044972 A1 | 4/2015 |
| WO | 2016109009 A1 | 7/2016 |
| WO | 2017050039 A1 | 3/2017 |
| WO | 2017050042 A1 | 3/2017 |
| WO | 2017050044 A1 | 3/2017 |
| WO | 2017050045 A1 | 3/2017 |
| WO | 2017050058 A1 | 3/2017 |
| WO | 2018069949 A2 | 4/2018 |
| WO | 2018096567 A2 | 5/2018 |
| WO | 2018114661 A1 | 6/2018 |
| WO | 2018179017 A1 | 10/2018 |
| WO | 2019073497 A1 | 4/2019 |
| WO | 2019186607 A1 | 10/2019 |
| WO | 2020109283 A2 | 6/2020 |
| WO | 2020131903 A1 | 6/2020 |
| WO | 2020131909 A1 | 6/2020 |
| WO | 2021061153 A1 | 4/2021 |
| WO | 2021180642 A1 | 9/2021 |
| WO | 2022069967 A1 | 4/2022 |
| WO | 2022072130 A1 | 4/2022 |
| WO | 2022094645 A1 | 5/2022 |
| WO | 2022124942 A1 | 6/2022 |

OTHER PUBLICATIONS

International Preliminary Report on Patentability for Application No. PCT/US2019/066899 dated Jul. 1, 2021 (9 pages).
International Preliminary Report on Patentability for Application No. PCT/US2019/066906 dated Jul. 1, 2021 (7 pages).
International Search Report and Written Opinion and Application No. PCT/US2019/066906 dated Mar. 18, 2020 (7 pages).
International Search Report and Written Opinion for Application No. PCT/IT2019/000023 dated Jul. 26, 2019 (9 pages).
International Search Report and Written Opinion for Application No. PCT/US2019/053525 dated Jun. 29, 2020 (12 pages).
International Search Report and Written Opinion for Application No. PCT/US2019/066899 dated Mar. 5, 2020 (10 pages).
European Patent Office. Extended European Search Report for application 19901142.0, dated Sep. 26, 2022 (12 pages).
International Search Report and Written Opinion for Related Application No. PCT/IT2017/000225 dated May 4, 2018 (11 pages).
International Search Report and Written Opinion for Related Application No. PCT/IT2018/000037 dated Jul. 17, 2018 (9 pages).
Chinese Patent Office for Application No. 201980083338.9 dated Jan. 30, 2024 (16 pages).

* cited by examiner

ELECTRICAL SENSOR ASSEMBLY

CROSS-REFERENCE TO RELATED APPLICATIONS

This application is a continuation of U.S. patent application Ser. No. 17/664,585, filed May 23, 2022, issued as U.S. Pat. No. 11,644,484, which is a continuation of U.S. patent application Ser. No. 17/414,887, filed Jun. 16, 2021, issued as U.S. Pat. No. 11,340,266, which is a national stage application of International Patent Application No. PCT/US2019/066899, filed Dec. 17, 2019, which claims priority to Italian Patent Application No. 102018000011146, filed Dec. 17, 2018, and to Italian Utility Model Application No. 202018000003942, filed Dec. 17, 2018, the entire contents of all of which are incorporated herein by reference.

FIELD OF THE DISCLOSURE

The present disclosure relates to an electrical sensor assembly, preferably intended for electrical transformers, electrical cabinets and other similar structures, that enables the electric field generated by a live connecting bar to be detected, for example to detect the voltage value of said connecting bar in relation to the detected electric field.

More specifically, the present disclosure relates to a sensor assembly that is able to detect the electric field generated by the connecting bar without being influenced by any surrounding electrical fields, such as the fields generated by other conductors arranged nearby.

BACKGROUND

Electrical sensor assemblies of the aforementioned type are known, but suffer from a series of drawbacks.

A first drawback is that said known sensor assemblies do not enable the electric field generated by the connecting bar to be detected without being influenced by other surrounding fields.

A second drawback is that said known sensor assemblies are somewhat large.

A third drawback is that said known sensor assemblies do not enable electrical fields and/or related magnitudes to be measured with sufficient accuracy.

A fourth drawback is that said known sensor assemblies are not immune to surrounding electrical fields generated, for example, by other conductors arranged nearby.

A fifth drawback is that said known sensor assemblies do not enable electrical fields and/or related magnitudes to be measured with sufficient accuracy in the presence of temperature variations.

A sixth drawback is that said known sensor assemblies do not retain over time the technical features required to perform the function of the sensor assembly and/or to maintain the required safety level (partial discharges, detachment, rapid ageing, etc.).

A seventh drawback is that said known sensor assemblies are complex and costly to make.

An eighth drawback is that, in said known sensor assemblies, the resin of dielectric material placed about the components of the sensor assembly have cavities (air bubbles), which results in unwanted partial discharging.

A ninth drawback is that, in said known sensor assemblies, said resin is detached from the elements that comprise the capacitive sensor, which results in unwanted partial discharging.

A tenth drawback is that, in said known sensor assemblies, said resin is not perfectly bonded and/or stuck and/or linked to the components that form the sensor assembly and consequently, ageing causes said resin to become detached from said members, which results in unwanted partial discharging. This drawback is particularly common where the sensor assembly is used in an environment in which the operating temperature (hot/cold) varies cyclically.

SUMMARY

Sensor assemblies according to embodiments of the present disclosure may advantageously resolve one or more of the aforementioned drawbacks.

For example, the present disclosure provides, in one aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a support member made of an insulating material. The support member includes an inner surface and an outer surface opposite the inner surface. The tubular body also includes a first section with an electric field sensor comprising a first layer of electrically conductive material disposed on the inner surface of the support member. The electric field sensor is configured to detect an electric field produced by the connecting bar. The first section also includes a first electric screen comprising a second layer of electrically conductive material disposed on the outer surface of the support member, and the first electric screen is configured to shield the electric field sensor from outside electrical interference. The tubular body also includes a second section disposed adjacent the first section along the longitudinal axis, the second section including a second electric screen. The sensor assembly further includes a dielectric material at least partially enclosing the tubular body.

The present disclosure provides, in another aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a support member made of an insulating material, the support member including an inner surface, an outer surface opposite the inner surface, and a plurality of cantilevered tabs extending parallel to the longitudinal axis. The tubular body also includes an electric field sensor comprising a first layer of electrically conductive material disposed on the inner surface of the support member, the electric field sensor configured to detect an electric field produced by the connecting bar, and a first electric screen comprising a second layer of electrically conductive material disposed on the outer surface of the support member, the first electric screen configured to shield the electric field sensor from outside electrical interference. The sensor assembly also includes a dielectric material at least partially enclosing the tubular body. Adjacent tabs of the plurality of cantilevered tabs are circumferentially spaced in order to form axial through openings therebetween.

The present disclosure provides, in another aspect, a sensor assembly including a connecting bar extending along a longitudinal axis and a body extending along the longitudinal axis and at least partially surrounding the connecting bar such that the body is radially spaced from the connecting bar. The body includes a support member made of an insulating material, with an inner surface and an outer surface. The body also includes a first section having an electric field sensor comprising a first layer of electrically conductive material disposed on the inner surface of the support member, the electric field sensor configured to detect an electric field produced by the connecting bar, and a first electric screen comprising a second layer of electrically conductive material disposed on the outer surface of the support member. The body also includes a second section having a second electric screen comprising a third layer of electrically conductive material, and a third section including a third electric screen comprising a fourth layer of electrically conductive material. The sensor assembly also includes a dielectric material at least partially enclosing the body. The first section is disposed between the second section and the third section along the longitudinal axis, and the first layer, the second layer, the third layer, and the fourth layer are electrically isolated from one another.

Other features and aspects of the disclosure will become apparent by consideration of the following detailed description and accompanying drawings.

Figure 1:
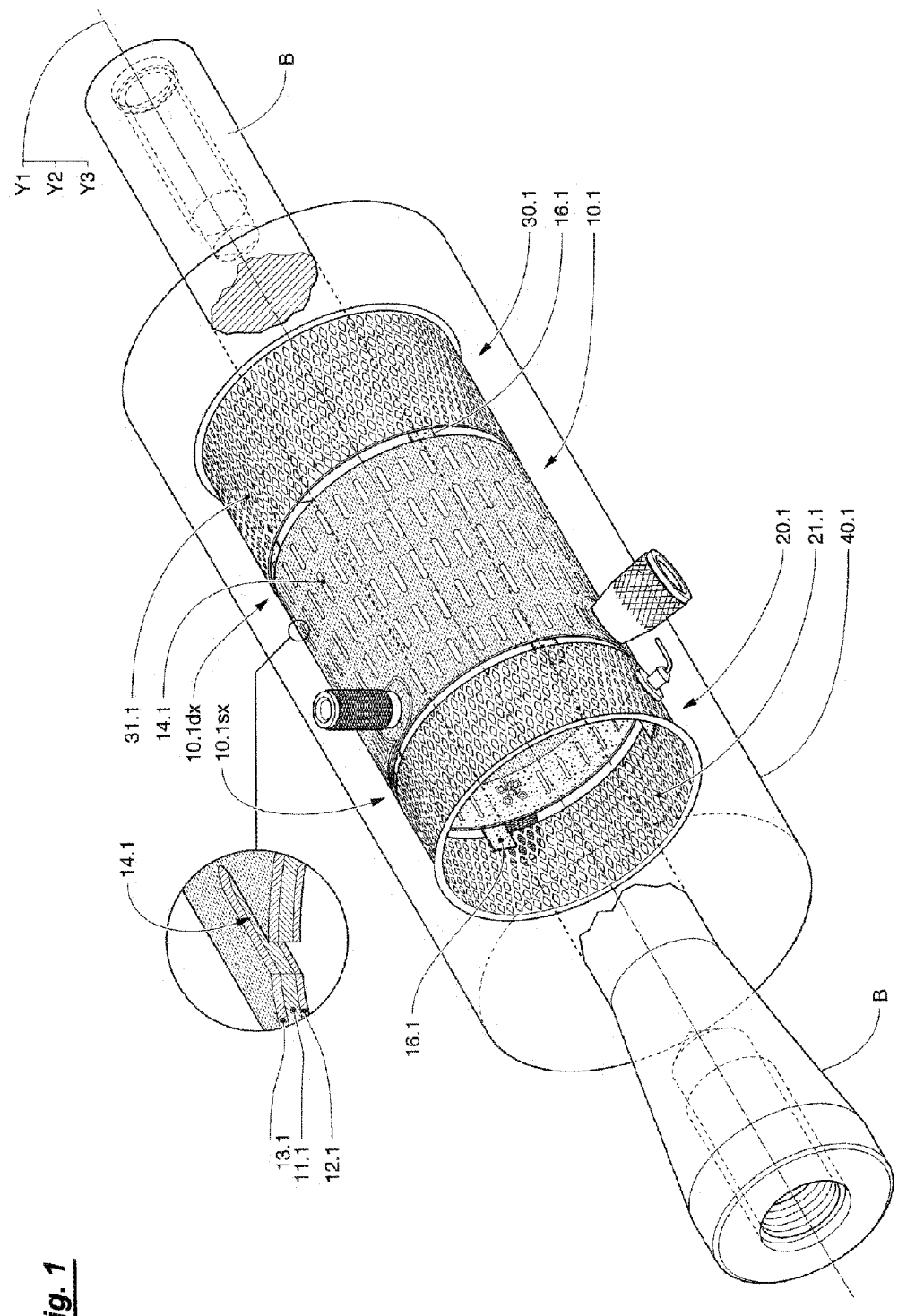
FIG. 1 is a schematic view of a first embodiment of a sensor assembly according to the present disclosure.

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting.

DETAILED DESCRIPTION

With reference to attached FIGS. 1 to 5A, a sensor assembly according to embodiments of the present disclosure extends along a first longitudinal axis Y1 and includes a connecting bar B extending longitudinally along a respective second longitudinal axis Y2; a tubular body extending longitudinally along a third longitudinal axis Y3; a mass of dielectric material 40.1/40.2/40.3/40.4/40.5 designed to at least partially enclose the components of the sensor assembly, in which said tubular body is positioned coaxially about said connecting bar B and is spaced radially apart from said central connecting bar B.

Again with reference to attached FIGS. 1 to 5A, said tubular body has a first tubular section 10.1/10.2/10.3/10.4/10.5, which in the illustrated embodiments includes: a first self-supporting tubular laminar element or support member 11.1/11.2/11.3/11.4/11.5 made of insulating material; a first thin layer of electrically conductive material 12.1/12.2/12.3/12.4/12.5 applied to one or more inner faces of said first self-supporting tubular laminar element 11.1/11.2/11.3/11.4/11.5; and a second thin layer of electrically conductive material 13.1/13.2/13.3/13.4/13.5 applied to one or more outer faces of said first self-supporting tubular laminar element 11.1/11.2/11.3/11.4/11.5.

The first self-supporting tubular laminar element 11.1/11.2/11.3/11.4/11.5 may perform the function of a supporting structure and, more specifically, the function of a tubular element not liable to suffer from deformation when casting resin and providing support using layers of conductive material.

The first thin layer of electrically conductive material 12.1/12.2/12.3/12.4/12.5 may function as an electric field sensor and, more specifically, is able to form a first electrode for a capacitive coupling with the central bar B as second electrode.

The second thin layer of electrically conductive material 13.1/13.2/13.3/13.4/13.5 may function as an electric screen and, more specifically, by connection to ground or to a known potential, an electric screen able to screen or shield the electric field sensor formed by the first thin layer of electrically conductive material 12.1/12.2/12.3/12.4/12.5 from external electrical fields or interference.

The tubular body of the sensor assembly can also include a second tubular section 20.1/20.2/20.3/20.4/20.5; in which said second tubular section 20.1/20.2/20.3/20.4/20.5 is positioned axially beside a first axial end (10sx) of the first tubular section 10.1/10.2/10.3/10.4/10.5; in which said second tubular section 20.1/20.2/20.3/20.4/20.5 may function as an electric screen, by connecting to ground or to a reference potential, as explained below.

Furthermore, the tubular body of the sensor assembly can also include a third tubular section 30.1/30.2/30.3/30.4/30.5; in which said third tubular section (30.1/30.2/30.3/30.4/30.5) is positioned axially beside a second axial end 10dx of the first tubular section 10.1/10.2/10.3/10.4/10.5; in which said third tubular section 30.1/30.2/30.3/30.4/30.5 may function as an electric screen, by connecting to ground or to a reference potential.

Said second tubular section 20.1/20.2/20.3/20.4/20.5 and/or said third tubular section 30.1/30.2/30.3/30.4/30.5 can also perform the function of an electric field sensor in order to detect the presence or absence of voltage on the connecting bar B.

The second tubular section 20.1/20.2/20.3/20.4/20.5 and/or said third tubular section 30.1/30.2/30.3/30.4/30.5 are associated with and/or linked to said first tubular section 10.1/10.2/10.3/10.4/10.5. Preferably, said first tubular section 10.1/10.2/10.3/10.4/10.5 and/or said second tubular section 20.1/20.2/20.3/20.4/20.5 and/or said third tubular section 30.1/30.2/30.3/30.4/30.5 includes one or more through-openings 14.1/14.2/14.3/14.4/14.5/21.1/21.2/21.3/21.4/21.4/31.1/31.2/31.3/31.4/31.5, which are wide enough to enable a resin of dielectric material in liquid/paste state to pass through said first through-openings 14.1/14.2/14.3/14.4/14.5; 21.1/21.2/21.3/21.4/21.5; 31.1/31.2/31.3/31.4/31.5.

Figure 1A:
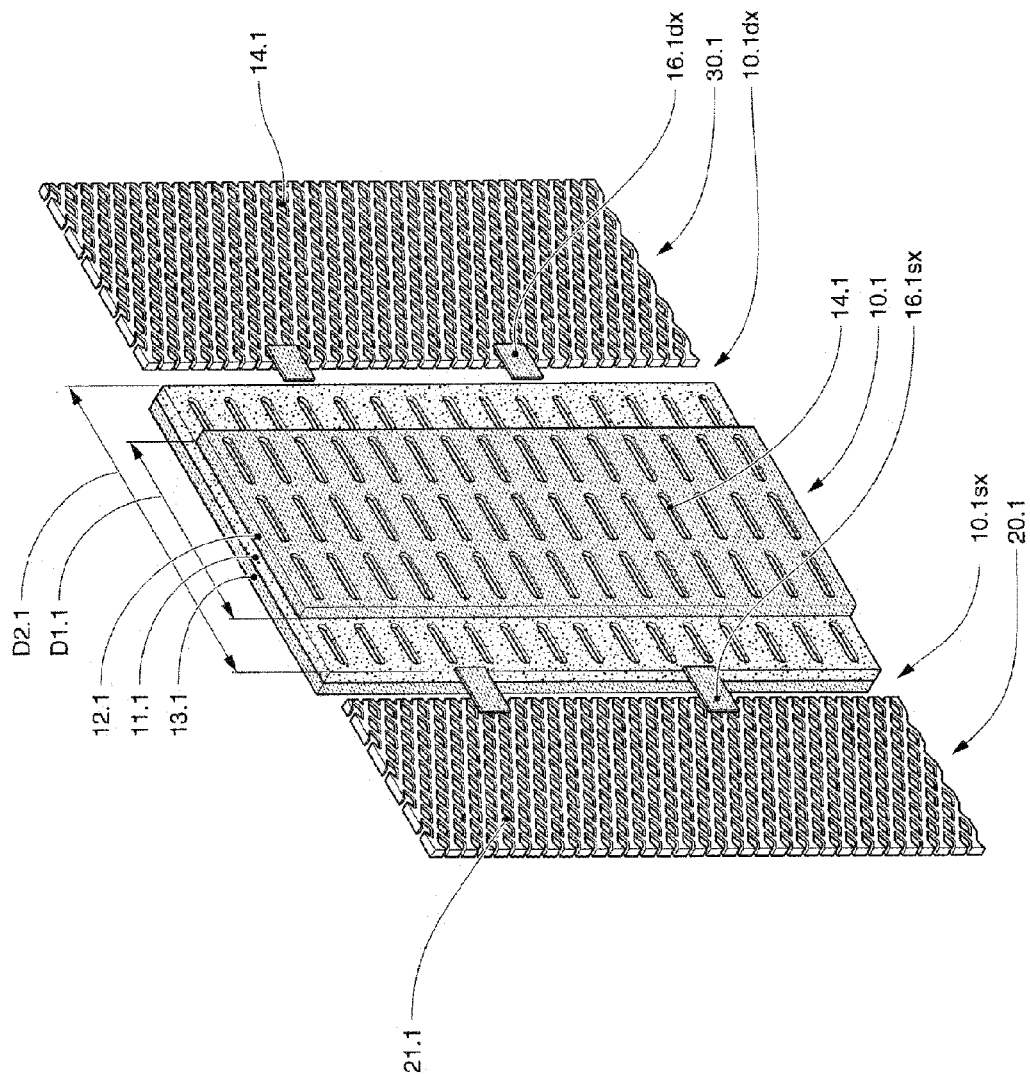
FIG. 1A is a schematic view of a tubular body in the embodiment in FIG. 1, laid flat.

With reference to FIGS. 1 and 1A, said first tubular section 10.1 can be made using a conductive double-sided Vetronite board (for example a copper double-sided Vetronite board—PCB) including a self-supporting lamina of insulating material 11.1 able to perform the support function, a first thin inner layer 12.1 of electrically conductive material detached from other layers of conductive material applied to said self-supporting lamina of insulating material 11.1 and a first thin outer layer 13.1 of conductive material applied to said self-supporting lamina of insulating material 11.1; in which the first thin inner layer 12.1 may function as an electric field sensor, i.e. to form a capacitive coupling with the bar B; and in which the first thin outer layer 13.1 may function as an electric screen, for example by means of a connection to ground.

Preferably, the first thin inner layer 12.1 of conductive material has an axial length D1.1 that is less than the axial length D2.1 of the first thin outer layer 13.1 of conductive material, preferably but without limitation as shown in FIG. 1A.

With reference to the aforementioned structural description, said first tubular section 10.1 may be made using a single conductive double-sided Vetronite board (for example a copper double-sided Vetronite board—PCB), for example etched by photoengraving or mechanical milling and wrapped into a tube shape.

Again with reference to FIGS. 1 and 1A, said second tubular section 20.1 and/or said third tubular section 30.1 can be made from a wire mesh, preferably electrically disconnected from other conductive elements, in which said wire mesh can be connected to ground in order to perform the function as an electric screen, and in which, where desired, said wire mesh can form a capacitive coupling with the bar B to detect the presence or absence of voltage on said bar B.

Figure 2:
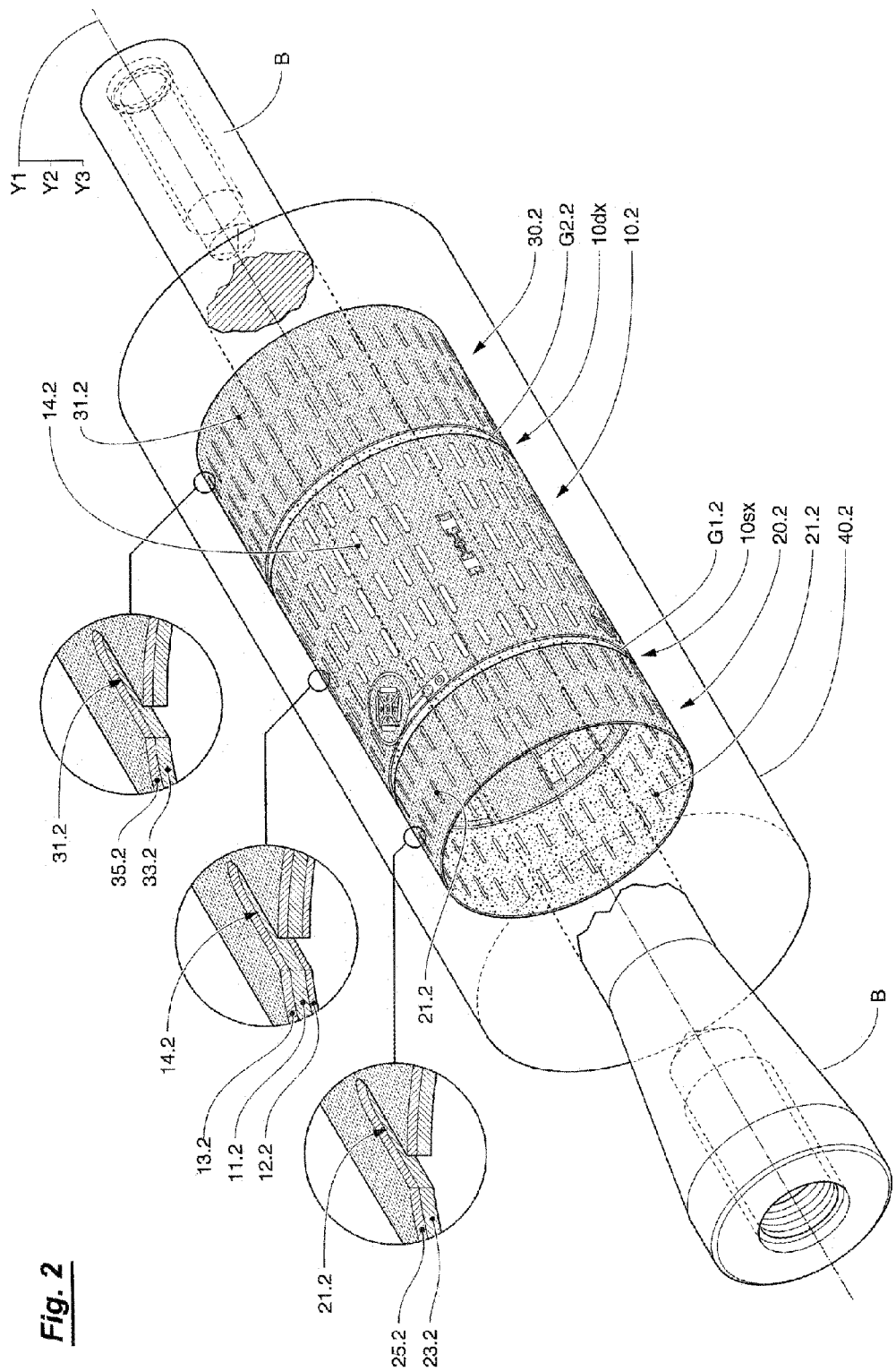
FIG. 2 is a schematic view of a second embodiment of a sensor assembly according to the present disclosure.
Figure 2A:
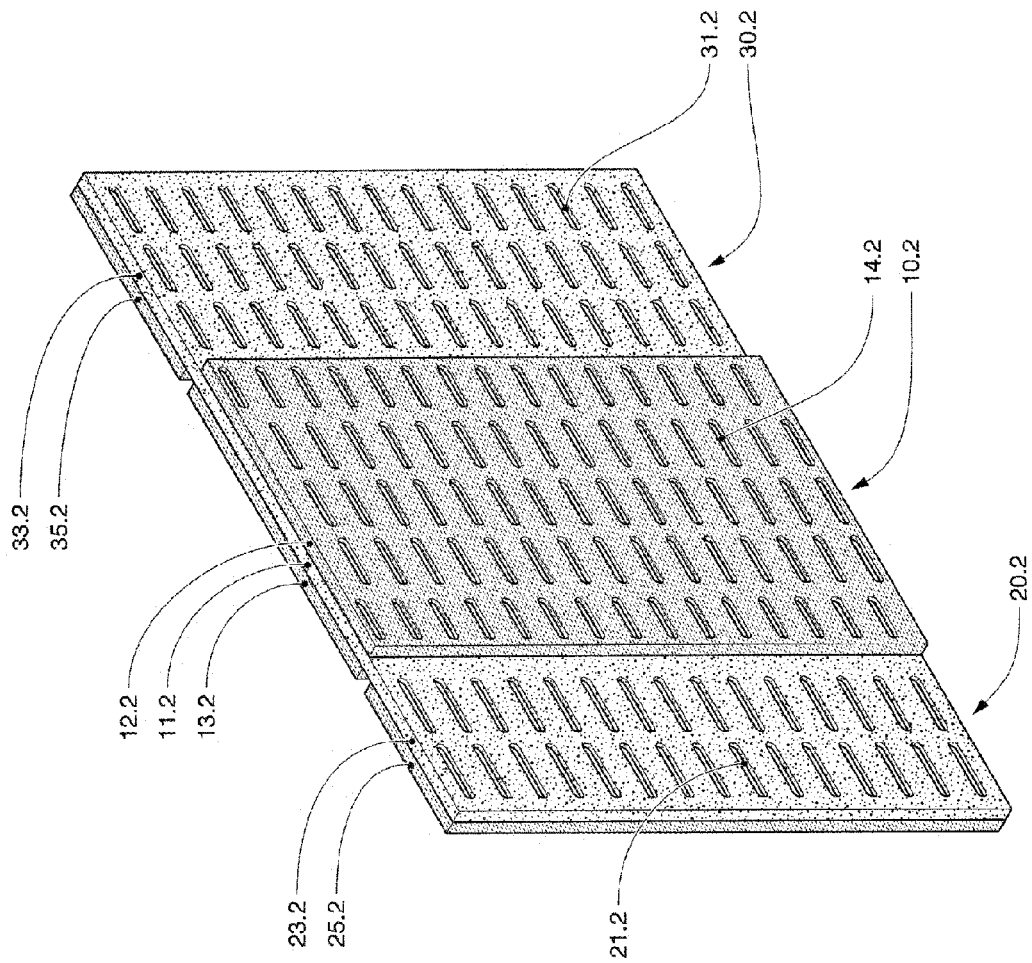
FIG. 2A is a schematic view of a tubular body in the embodiment in FIG. 2, laid flat.

With reference to FIGS. 2 and 2A, said sensor assembly, and more specifically said tubular body including said first, second and third tubular sections 20.2/10.2/30.2, can include: a self-supporting lamina of insulating material 23.2/11.2/33.2 able to perform the support function; a first thin inner layer 12.2 of electrically conductive material applied to said self-supporting lamina of insulating material 23.2/11.2/33.2 and electrically disconnected from the other layers of conductive material; a first thin outer layer 25.2 of conductive material applied to said self-supporting lamina of insulating material 23.2/11.2/33.2; a second thin outer layer 13.2 of conductive material applied to said self-supporting lamina of insulating material 23.2/11.2/33.2; a third thin outer layer 35.2 of conductive material applied to said self-supporting lamina of insulating material 23.2/11.2/33.2, in which said layers have specific axial lengths, preferably but without limitation as shown in FIG. 2A.

The first thin inner layer 12.2 may function as an electric field sensor, i.e. to form a capacitive coupling with the bar B; the first thin outer layer 25.2 may function as an electric screen, for example by connection to ground, and/or the function of detecting the presence or absence of voltage on the bar B; the second thin outer layer 13.2 may function as an electric screen, for example by means of a connection to ground; the third thin outer layer 35.2 may function as an electric screen, for example by means of a connection to ground; and/or the function of detecting the presence or absence of voltage on the bar B.

Preferably, with reference to the aforementioned structural description, said first tubular section 10.2, said second tubular section 20.2 and said third tubular section 30.2 are made using a single conductive double-sided Vetronite board (for example a copper double-sided Vetronite board—PCB), for example etched by photoengraving or mechanical milling and wrapped into a tube shape.

Figure 3:
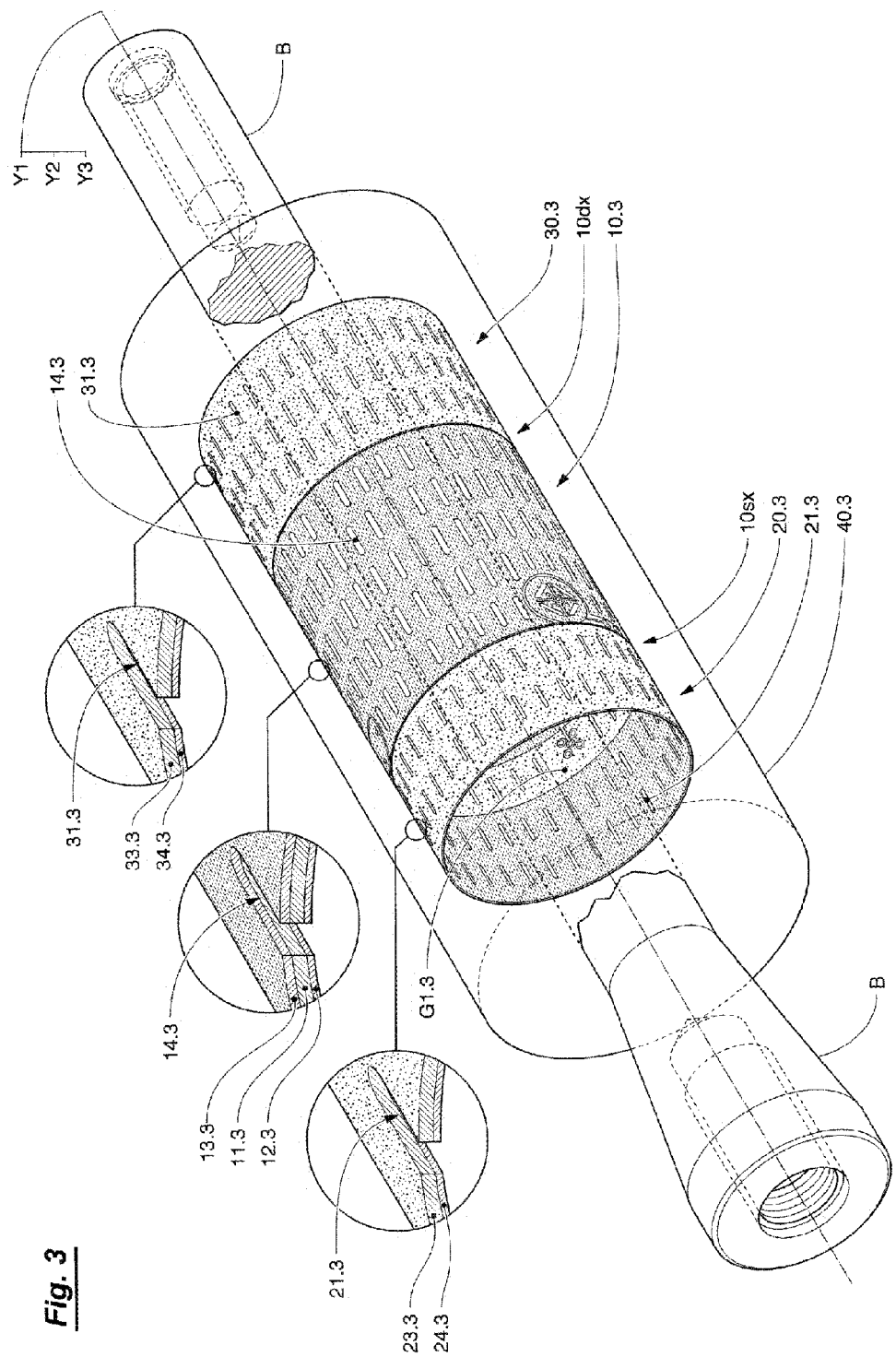
FIG. 3 is a schematic view of a third embodiment of a sensor assembly according to the present disclosure.
Figure 3A:
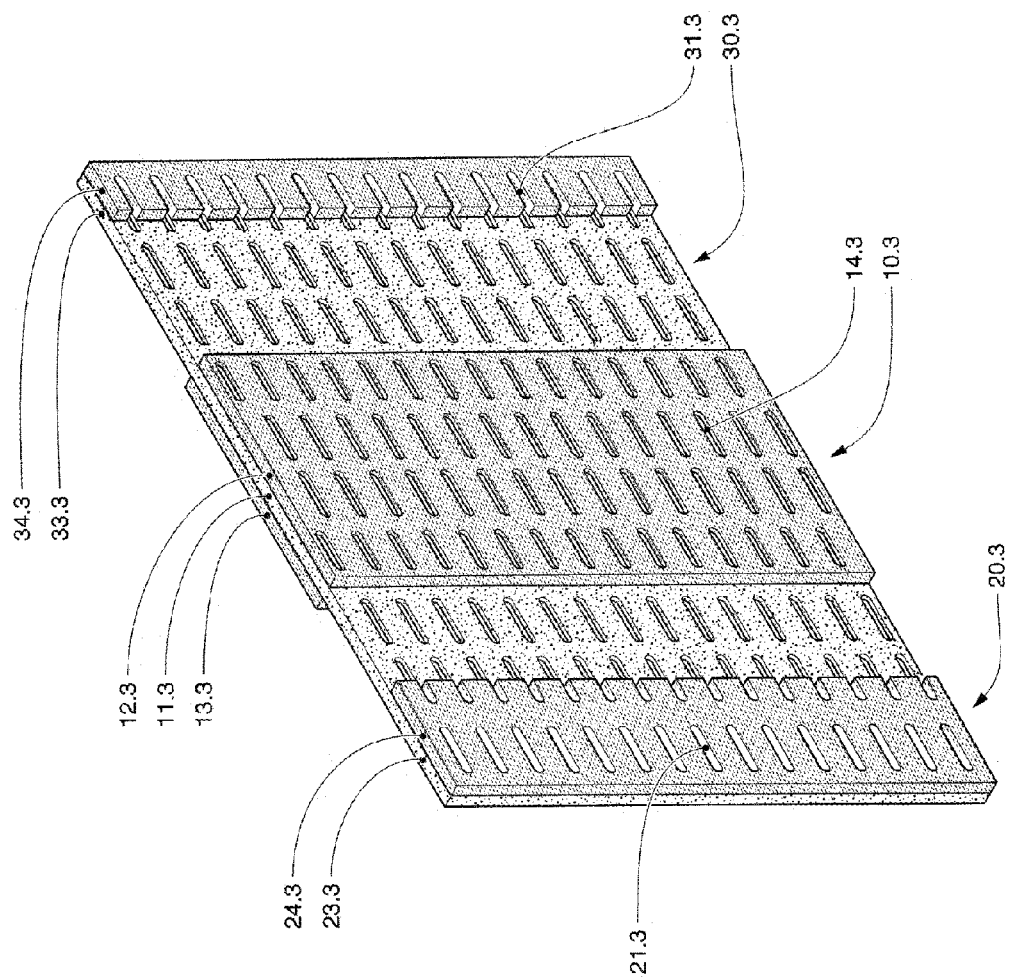
FIG. 3A is a schematic view of a tubular body in the embodiment in FIG. 3, laid flat.

With reference to FIGS. 3 and 3A, said sensor assembly, and more specifically said tubular body including said first, second and third tubular sections 20.3/10.3/30.3, can include: a self-supporting lamina of insulating material 23.3/11.3/33.3 able to perform the function of support lamina; a first thin inner layer 24.3 of conductive material applied to said self-supporting lamina of insulating material 23.3/11.3/33.3; a second thin inner layer 12.3 of conductive material applied to said self-supporting lamina of insulating material 23.3/11.3/33.3 and electrically disconnected from the other layers of conductive material; a third thin inner layer 34.3 of conductive material applied to said self-supporting lamina of insulating material 23.3/11.3/33.3; a first thin outer layer 13.3 of conductive material applied to said self-supporting lamina of insulating material 23.3/11.3/33.3; in which said layers have specific axial lengths, preferably but without limitation as shown in FIG. 3A.

The first thin inner layer 24.3 may function as an electric screen, for example by connection to ground, and/or the function of detecting the presence or absence of voltage on the bar B.

The second thin inner layer 12.3 may function as an electric field sensor, i.e. to form a capacitive coupling with the bar B.

The third thin inner layer 34.3 of conductive material may function as an electric screen, for example by connection to ground, and/or the function of detecting the presence or absence of voltage on the bar B.

The first thin outer layer 13.3 may function as an electric screen, for example by means of a connection to ground.

Preferably, with reference to the aforementioned structural description, said first tubular section 10.3, said second tubular section 20.3 and said third tubular section 30.3 are made using a single conductive double-sided Vetronite board (for example a copper double-sided Vetronite board—PCB), for example etched by photoengraving or mechanical milling and wrapped into a tube shape.

With reference to FIGS. 4-4A and 5-5A, the second tubular section 20.4/20.5 and/or said third tubular section 30.4/30.5 includes one or more cantilevered tabs 22.4, 32.4/22.5, 32.5.

More specifically, with reference to FIGS. 4-4A and 5-5A, the sensor assembly according to the present invention, in which said sensor assembly extends along a first longitudinal axis Y1, in which said sensor assembly comprises: a connecting bar B extending longitudinally along a respective second longitudinal axis Y2; a tubular body extending longitudinally along a third longitudinal axis Y3; a mass of dielectric material 40.4/40.5 designed to at least partially enclose the components of the sensor assembly; in which said tubular body is positioned coaxially about said connecting bar B; in which said tubular body is spaced apart radially from said central connecting bar B; has a tubular body with one or more cantilevered tabs 22.4, 32.4/22.5, 32.5.

Said tabs 22.4, 32.4/22.5, 32.5 are preferably oriented axially Y4 such that the free ends thereof 23.4, 33.4/23.5, 33.5 form at least one axial end of said tubular body, thereby forming crenelated axial ends.

Again preferably, two or more tabs 22.4/22.4, 32.4/32.4/22.5/22.5, 32.5/32.5, positioned side by side, are provided, in which the axial edge of a first tab 22.4, 32.4/22.5, 32.5 is spaced apart D4.4/D4.5 circumferentially from the axial edge of a second tab 22.4, 32.4/22.5, 32.5 positioned next to said first tab 22.4, 32.4/22.5, 32.5 in order to form axial through-openings 21.4/21.5.

Said through-openings 21.4 are wide enough to enable a resin of dielectric material in liquid/paste state to pass through said through-openings 21.4.

Again preferably, said tabs 22.4, 32.4/22.5, 32.5 are flexible and, more specifically, have a degree of flexibility selected in consideration of the shrinkage characteristics of the resin used in the casting, in order to enable said tabs to flex during the shrinkage phases of the resin that occur during solidification of said resin.

Figure 4:
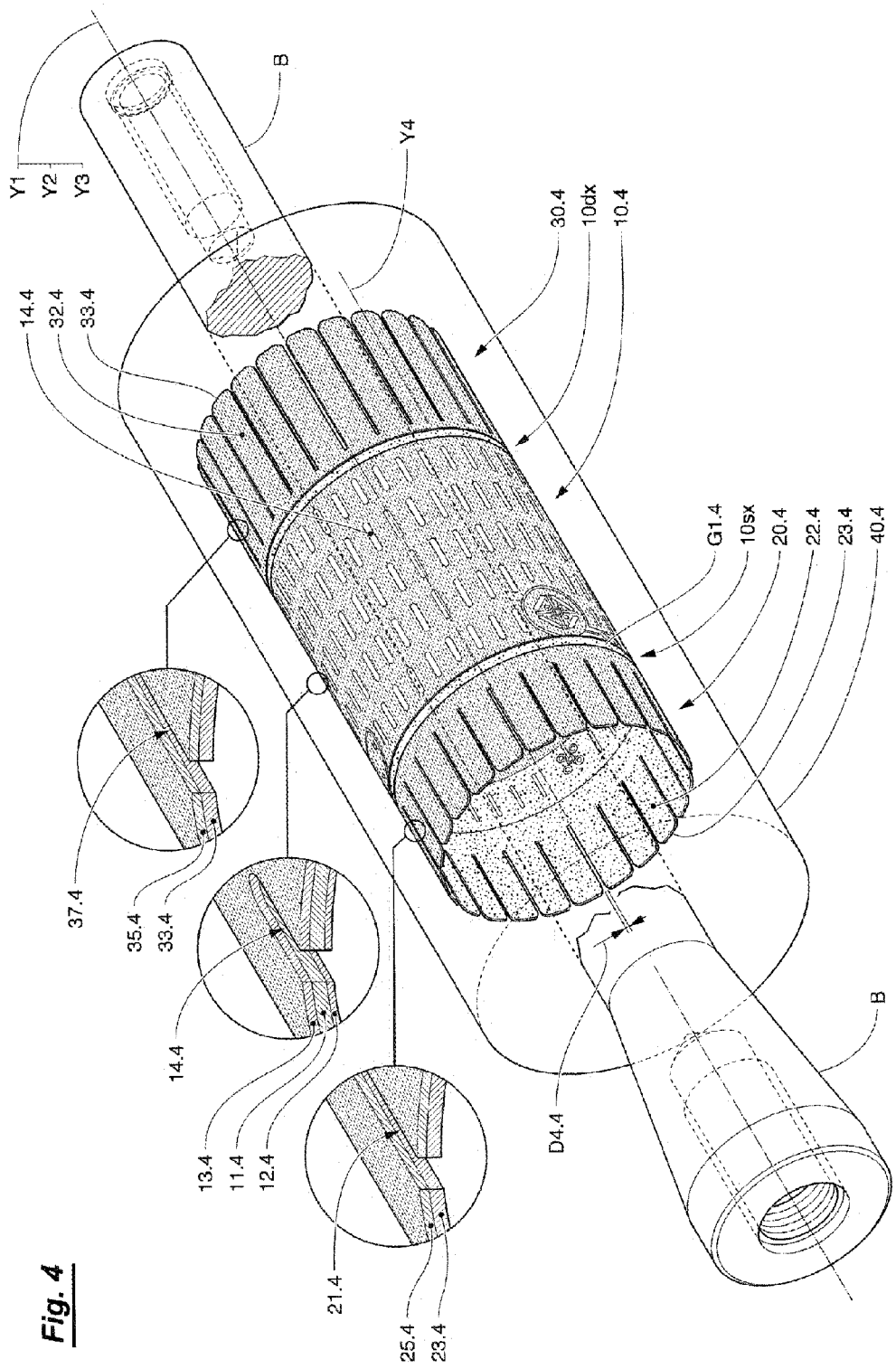
FIG. 4 is a schematic view of a fourth embodiment of a sensor assembly according to the present disclosure.
Figure 4A:
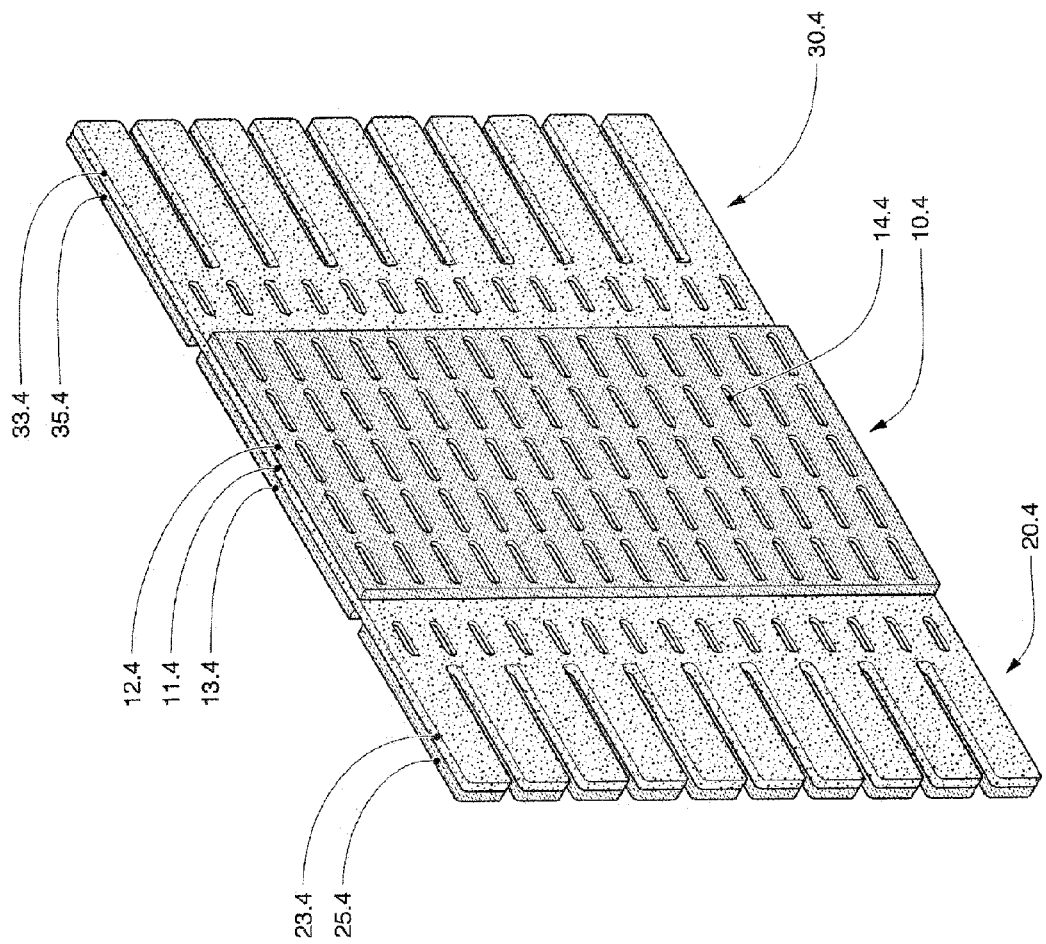
FIG. 4A is a schematic view of a tubular body in the embodiment in FIG. 4, laid flat.

With reference to FIGS. 4 and 4A, said sensor assembly, and more specifically said tubular body including said first, second and third tubular sections 20.4/10.4/30.4, can include: a self-supporting lamina of insulating material 23.4/11.4/33.4 able to perform the support function; a first thin inner layer 12.4 of electrically conductive material applied to said self-supporting lamina of insulating material 23.4/11.4/33.4 and electrically disconnected from the other layers of conductive material; a first thin outer layer 25.4 of conductive material applied to said self-supporting lamina of insulating material 23.4/11.4/33.4; a second thin outer layer 13.4 of conductive material applied to said self-supporting lamina of insulating material 23.4/11.4/33.4; a third thin outer layer 35.4 of conductive material applied to said self-supporting lamina of insulating material 23.4/11.4/33.4.

The first thin inner layer 12.4 may function as an electric field sensor, i.e. to form a capacitive coupling with the bar B.

The first thin outer layer 25.4 may function as an electric screen, for example by connection to ground, and/or the function of detecting the presence or absence of voltage on the bar B.

The second thin outer layer 13.4 may function as an electric screen, for example by means of a connection to ground.

The third thin outer layer 35.4 may function as an electric screen, for example by connection to ground, and/or the function of detecting the presence or absence of voltage on the bar B.

Preferably, with reference to the aforementioned structural description, said first tubular section 10.4, said second tubular section 20.4 and said third tubular section 30.4 are made using a single copper double-sided Vetronite board (PCB), for example etched by photoengraving or mechanical milling and wrapped into a tube shape.

Figure 5:
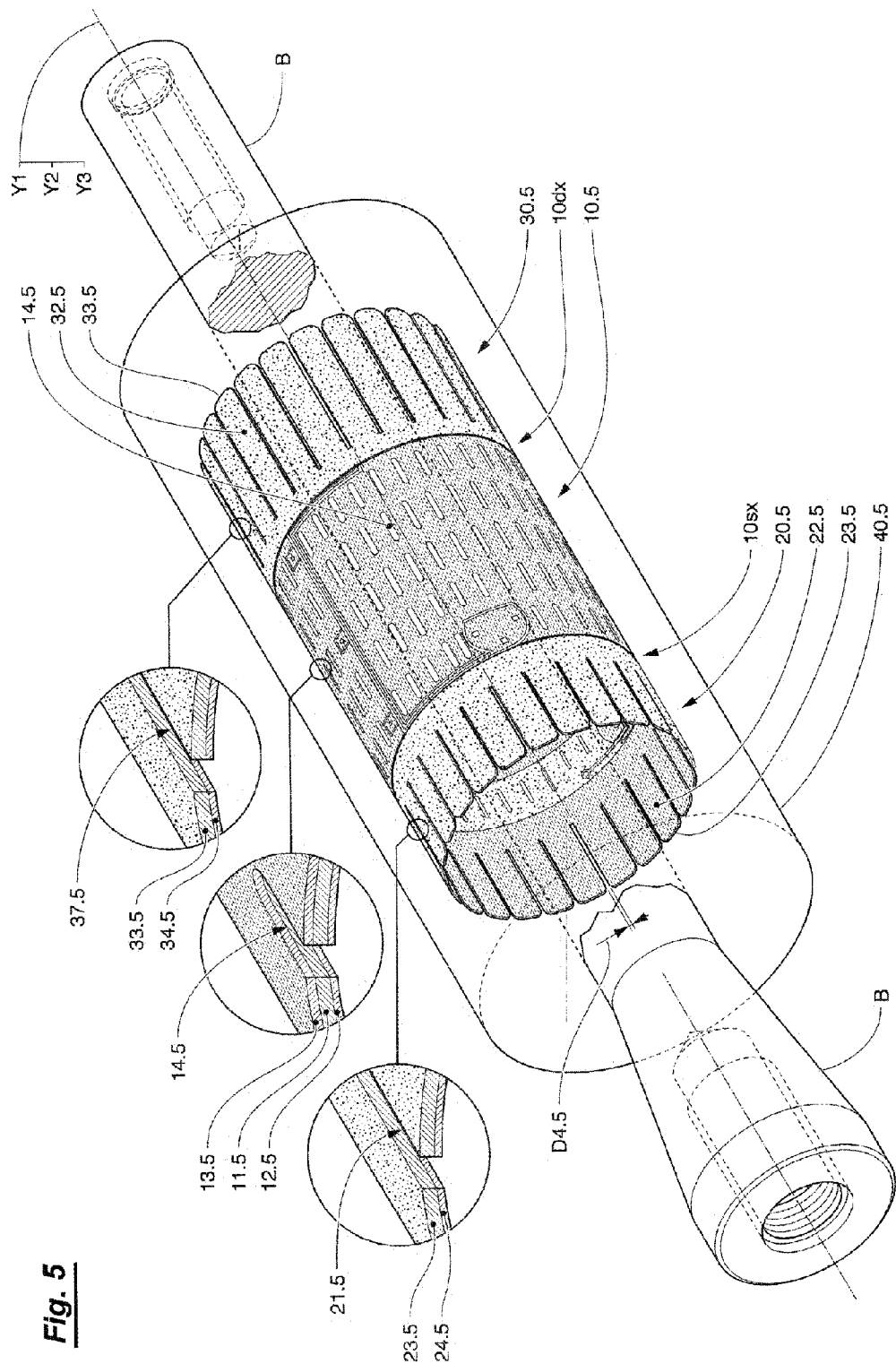
FIG. 5 is a schematic view of a fifth embodiment of a sensor assembly according to the present disclosure.
Figure 5A:
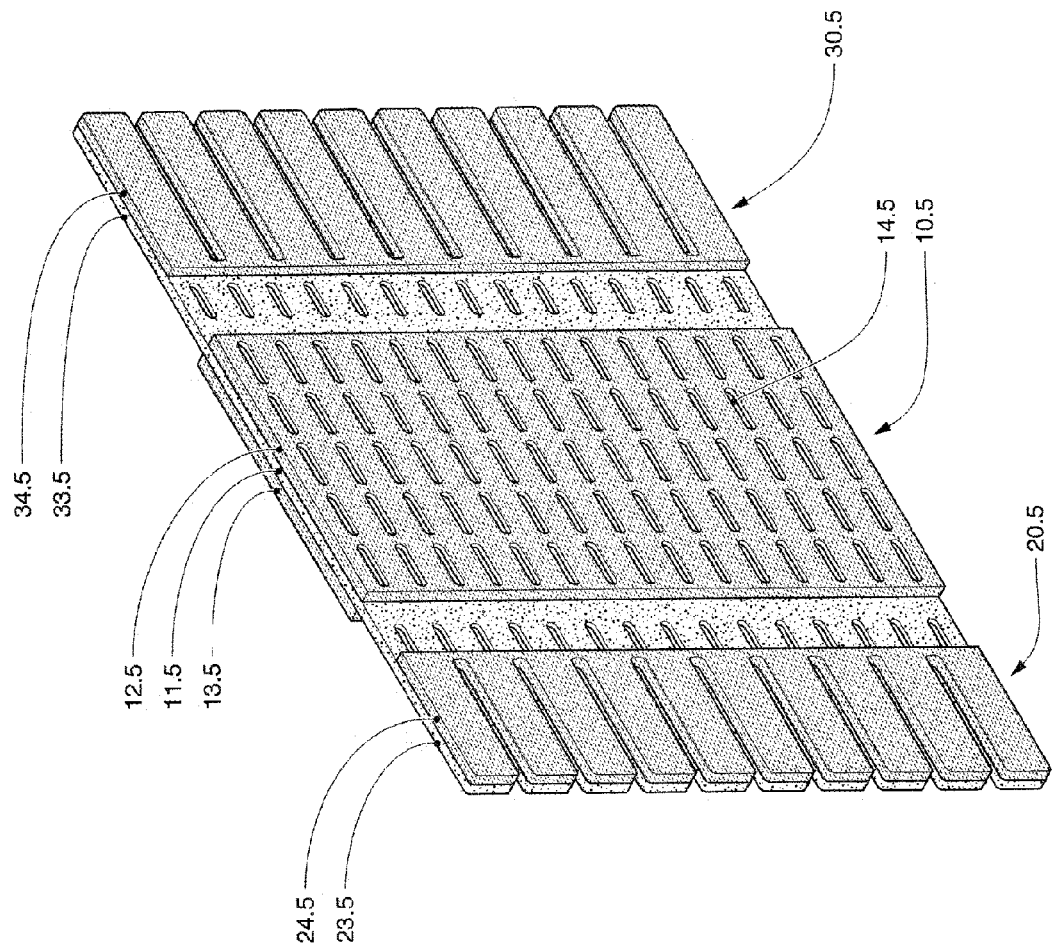
FIG. 5A is a schematic view of a tubular body in the embodiment in FIG. 5, laid flat.

With reference to FIGS. 5 and 5A, said sensor assembly, and more specifically said tubular body including said first, second and third tubular sections 20.5/10.5/30.5, can include: a self-supporting lamina of insulating material 23.5/11.5/33.5 able to perform the support function; a first thin outer layer 13.5 of conductive material applied to said self-supporting lamina of insulating material 23.5/11.5/33.5; a first thin inner layer 24.5 of conductive material applied to said self-supporting lamina of insulating material 23.5/11.5/33.5; a second thin inner layer 12.5 of conductive material applied to said self-supporting lamina of insulating material 23.5/11.5/33.5; and a third thin inner layer 34.5 of conductive material applied to said self-supporting lamina of insulating material 23.4/11.4/33.4.

The first thin outer layer 13.5 may function as an electric screen, for example by means of a connection to ground.

The first thin inner layer 24.5 may function as an electric screen, for example by connection to ground, and/or the function of detecting the presence or absence of voltage on the bar B.

The second thin inner layer 12.5 may function as an electric field sensor, i.e. to form a capacitive coupling with the bar B.

The third thin inner layer 34.5 may function as an electric screen, for example by connection to ground, and/or the function of detecting the presence or absence of voltage on the bar B.

Preferably, with reference to the aforementioned description, said first tubular section 10.5, said second tubular section 20.5 and said third tubular section 30.5 are made using a single copper double-sided Vetronite board (PCB), for example etched by photoengraving or mechanical milling and wrapped into a tube shape.

Although the disclosure has been described in detail with reference to certain preferred embodiments, variations and modifications exist within the scope and spirit of one or more independent aspects of the disclosure as described. In addition, some aspects of the present disclosure may include, but are not limited to:

Aspect 1. Sensor assembly regarding a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (4.1/40.2/40.3/40.4/40.5) able for incorporating at least partially the components of the sensor assembly; wherein said tubular body is positioned coaxially around said connecting bar (B); wherein said tubular body is radially spaced with respect to said central connecting bar (B); characterized by the fact that said tubular body comprises a first tubular section (10.1/10.2/10.3/10.4/10.5) comprising: a first self-supporting tubular laminar element (11.1/11.2/11.3/11.4/11.5) made of insulating material; a first thin layer of electrically conductive material (12.1/12.2/12.3/12.4/12.5) applied on one or more inner faces of said first self-supporting tubular laminar element (11.1/11.2/11.3/11.4/11.5); a second thin layer of electrically conductive material (13.1/13.2/13.3/13.4/13.5) applied on one or more external faces of said first self-supporting tubular laminar element (11.1/11.2/11.3/11.4/11.5); by the fact that said first self supporting tubular laminar element (11.1/11.2/11.3/11.4/11.5) is able to perform the function of supporting structure; by the fact that said first thin layer of electrically conductive material (12.1/12.2/12.3/12.4/12.5) is able to perform the function of an electric field sensor; by the fact that said second thin layer of electrically conductive material (13.1/13.2/13.3/13.4/13.5) is able to perform the function of an electric screen; by the fact to further comprising a second tubular section (20.1/20.2/20.3/20.4/20.5); by the fact that said second tubular section (20.1/20.2/20.3/20.4/20.5) is positioned axially at the side of a first axial end (10$sx$) of the first tubular section (10.1/10.2/10.3/10.4/10.5); and by the fact that said second tubular section (20.1/20.2/20.3/20.4/20.5) is able to perform the function of electric screen.

Aspect 2. Sensor assembly according to aspect 1, characterized by the fact that it further comprises a third tubular section (30.1/30.2/30.3/30.4/30.5); by the fact that said third tubular section (30.1/30.2/30.3/30.4/30.5) is positioned axially at the side of a second axial end (10$dx$) of the first tubular section (10.1/10.2/10.3/10.4/10.5); and by the fact that said third tubular section (30.1/30.2/30.3/30.4/30.5) is able to perform the function of electric screen.

Aspect 3. Sensor assembly according to aspect 1 or 2, characterized by the fact that said first tubular section (10.1) is made by means of a double-sided plain copper PCB and by the fact that said second tubular section (20.1) and/or said third tubular section (30.1) are made of a wire mesh.

Aspect 4. Sensor assembly according to one of aspects 1 to 3, characterized in that it comprises: a self-supporting lamina of insulating material (23.2/11.2/33.2) suitable for carrying out the support function; a first thin inner layer (12.2) of conductive material applied to said self-supporting lamina of insulating material (23.2/11.2/33.2) and electrically disconnected with respect the other layers of conductive material; a first thin outer layer (25.2) of conductive material applied to said self-supporting lamina of insulating material (23.2/11.2/33.2); a second thin outer layer (13.2) of conductive material applied to said self-supporting lamina of insulating material (23.2/11.2/33.2); and a third thin outer layer (35.2) of conductive material applied to said self-supporting lamina of insulating material (23.2/11.2/33.2) and by the fact that the first thin inner layer (12.2) is able to perform the function of sensor of the electric field generated by the connecting bar (B), the first thin outer layer (25.2) is able to perform the function of an electric screen, the second thin outer layer (13.2) is suitable to perform the function of an electric screen; and the third thin outer layer (35.2) is adapted to perform the function of an electric screen.

Aspect 5. Sensor assembly according to aspect 4, characterized by the fact that said first tubular section (10.2) said second tubular section (20.2) and said third tubular section (30.2) are made by means of a double-sided plain copper PCB.

Aspect 6. Sensor assembly according to aspect 1 or 2, characterized by the fact that it comprises: a self-supporting foil of insulating material (23.3/11.3/33.3) suitable for carrying out the supporting foil function; a first thin inner layer (24.3) of conductive material applied to said self-supporting lamina of insulating material (23.3/11.3/33.3); a second thin inner layer (12.3) of conductive material applied to said self-supporting lamina of insulating material (23.3/11.3/33.3) and electrically disconnected from the other layers of conductive material; a third thin inner layer (33.3) of conductive material applied to said self-supporting lamina of insulating material (23.3/11.3/33.3); a first thin outer layer (13.3) of conductive material applied to said self-supporting lamina of insulating material (23.3/11.3/33.3); and by the fact that the first thin inner layer (24.3) is able to perform the function of an electric screen, the second thin inner layer (12.3) is able to perform the function of sensor of the electric field generated by the connecting bar (B), the third thin inner layer (34.3) is able to perform the function of an electric screen, the first thin outer layer (13.3) is able to perform the function of an electric screen.

Aspect 7. Sensor assembly according to aspect 6, characterized by the fact that said first tubular section (10.3) said second tubular section (20.3) and said third tubular section (30.3) are made by means of double-sided plain copper PCB.

Aspect 8. Sensor assembly according to any one of aspects 1 to 7, characterized by the fact that said second tubular section (20.4/20.5) and/or said third tubular section (30.4/30.5) comprises one or more tabs (22.4, 32.4/22.5, 32.5) supported in an by cantilever manner.

Aspect 9. Sensor assembly regarding a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (40.4/40.5) able for incorporating at least partially the components of the sensor assembly; wherein said tubular body is positioned coaxially around said connecting bar (B); wherein said tubular body is radially spaced with respect to said central connecting bar (B); characterized by the fact that said tubular body comprises one or more tabs (22.4, 32.4/22.5, 32.5) supported in a cantilever manner.

Aspect 10. Sensor assembly according to aspect 8 or 9, characterized by the fact that said tabs (22.4, 32.4/22.5, 32.5) are axially oriented (Y4) in order to configure with their free ends (23.4, 33.4/23.5, 33.5) at least one axial end of the tubular body.

Aspect 11. Sensor assembly according to aspect 8, 9 or 10, characterized by the fact to comprises two or more tabs (22.4/22.4, 32.4/32.4/22.5/22.5, 32.5/32.5) positioned side by side.

Aspect 12. Sensor assembly according to aspect 11, characterized by the fact that the axial edge of a first tab (22.4, 32.4/22.5, 32.5) is circumferentially spaced (D4.4/D4.5) with respect to the axial edge of a second tab (22.4, 32.4/22.5, 32.5) positioned next to said first tab (22.4, 32.4/22.5, 32.5) in order to form axial through openings (21.4/21.5).

Aspect 13. Sensor assembly according to one of the aspects from 8 to 12, characterized by the fact that said tabs (22.4, 32.4/22.5, 32.5) are flexible.

Aspect 14. Sensor assembly according to one of the aspects from 1 to 13, characterized by the fact that at least one axial end of said tubular body has the shape.

Aspect 15. Sensor assembly according to one of the aspects from 8 to 14, characterized by the fact that it comprises: a self-supporting foil of insulating material (23.4/11.4/33.4) able for carrying out the support function; a first thin inner layer (12.4) of conductive material electrically applied to said self-supporting lamina of insulating material (23.4/11.4/33.4) and disconnected from the other layers of conductive material; a first thin outer layer (25.4) of conductive material applied to said self-supporting lamina of insulating material (23.4/11.4/33.4); a second thin outer layer (13.4) of conductive material applied to said self-supporting lamina of insulating material (23.4/11.4/33.4); a third thin outer layer (35.4) of conductive material applied to said self-supporting lamina of insulating material (23.4/11.4/33.4); and by the fact that the first thin inner layer (12.4) is able to detect the electric field generated by the connecting rod (B), the first thin outer layer (25.4) is able to perform the function of an electric screen, the second thin outer layer (13.4) is able to perform the function of an electric screen, the third thin outer layer (35.4) is able to perform the function of an electric screen.

Aspect 16. Sensor assembly according to aspect 15, characterized by the fact that said first tubular section (10.4) said second tubular section (20.4) and said third tubular section (30.4) are made by are made by means of a double-sided plain copper PCB.

Aspect 17. Sensor assembly according to one of the aspects from 8 to 24, characterized by the fact that it comprises: a self-supporting foil of insulating material (23.5/11.5/33.5) suitable for carrying out the support function; a first thin outer layer (13.5) of conductive material applied to said self-supporting lamina of insulating material (23.5/11.5/33.5); a first thin inner layer (24.5) of conductive material applied to said self-supporting lamina of insulating material (23.5/11.5/33.5); a second thin inner layer (12.5) of conductive material applied to said self-supporting lamina of insulating material (23.5/11.5/33.5); a third thin inner layer (34.5) of conductive material applied to said self-supporting lamina of insulating material (23.4/11.4/33.4); and by the fact that the first thin outer layer (13.5) is able to perform the function of an electric screen, the first thin inner layer (24.5) is able to perform the function of an electric screen, the second thin inner layer (12.5) is able to perform the electric field generated by the connecting bar (B), the third thin inner layer (34.5) is able to perform the function of an electric screen.

Aspect 18. Sensor assembly according to aspect 17, characterized by the fact that said first tubular section (10.5) said second tubular section (20.5) and said third tubular section (30.5) are made by a double-sided plain copper PCB.

Various features of the disclosure are set forth in the following claims.

What is claimed is:

1. A sensor assembly comprising:
    an electrode extending along a longitudinal axis;
    a tubular section extending along the longitudinal axis and at least partially surrounding the electrode such that the tubular section is radially spaced from the electrode, the tubular section including
        a first layer made of an electrically insulating material, the first layer having a first length,
        a second layer made of an electrically conductive material disposed on an inner surface of the first layer made of insulating material, the second layer having a second length, and
        a third layer made of an of electrically conductive material disposed on an outer surface of the first layer made of an insulating material, the third layer having a third length; and
    a mass of dielectric material at least partially enclosing the electrode and the tubular section, wherein the mass of dielectric insulating material fills through openings in the tubular section,
    wherein the second length and the third length are coextensive.

2. The sensor assembly of claim 1, wherein the first length is greater than the second length and the third length.

3. The sensor assembly of claim 1, wherein the second layer made of electrically conductive material is configured as an electric field sensor to detect an electric field produced by the electrode and the third layer made of electrically conductive material is configured as an electric screen.

4. The sensor assembly of any one of claim 1, wherein the first layer made of electrically insulating material includes a first plurality of through openings, each configured as an elongated slit that has a length extending in a direction parallel to the longitudinal axis,
    wherein the second layer made of electrically conductive material includes a second plurality of through openings, each configured as an elongated slit that has a length extending in a direction parallel to the longitudinal axis, and
    wherein the third layer of electrically conductive material includes a third plurality of through openings, each configured as an elongated slit that has a length extending in a direction parallel to the longitudinal axis.

5. The sensor assembly of claim 4, wherein the first plurality of through openings in the first layer made of electrically insulating material includes a first row of circumferentially spaced through openings and a second row of circumferentially spaced through openings and at least one through opening of the first row of through openings is aligned with a through opening of the second row of through openings in a direction parallel to the longitudinal axis,
    wherein the second plurality of through openings in the second layer made of electrically conductive material includes a first row of circumferentially spaced through openings and a second row of circumferentially spaced through openings and at least one through opening of the first row of through openings is aligned with a through opening of the second row of through openings in a direction parallel to the longitudinal axis, and
    wherein the third plurality of through openings in the third layer made of electrically insulating material includes a first row of circumferentially spaced through openings and a second row of circumferentially spaced through openings and wherein at least one through opening of the first row of through openings is aligned with a through opening of the second row of through openings in a direction parallel to the longitudinal axis.

6. The sensor assembly of claim 5, wherein each through opening of the first row of the first plurality of through openings is aligned in a direction parallel to the longitudinal axis with a through opening in the second row of through openings of the first plurality of through openings,
    wherein each through opening of the first row of the second plurality of through openings is aligned in a direction parallel to the longitudinal axis with a through opening in the second row of through openings of the second plurality of through openings, and
    wherein each through opening of the first row of through openings of the plurality of through openings is aligned in a direction parallel to the longitudinal axis with a through opening of the third row of through openings of the third plurality of through openings.

7. The sensor assembly of claim 6, wherein each through opening of the second plurality of through openings is aligned with a through opening of the first plurality of through openings, and wherein each through opening in the third plurality of through openings is aligned with a through opening in the first plurality of through openings.

8. The sensor assembly of claim 1, wherein the tubular section comprises a double-sided printed circuit board wrapped into a tube shape.

9. The sensor assembly of claim 8, wherein the printed circuit board includes a layer of copper on each side.

10. The sensor assembly of claim 1, wherein the mass of dielectric insulating material comprises dielectric resin molded around and through the tubular section.

11. A sensor assembly comprising:
    an electrode extending along a longitudinal axis;
    a tubular section extending along the longitudinal axis and at least partially surrounding the electrode such that the tubular section is radially spaced from the electrode, the tubular section including
        a first layer made of an electrically insulating material,
        a second layer made of an electrically conductive material disposed on an inner surface of the first layer made of insulating material, wherein the second layer made of electrically conductive material is configured as an electric field sensor to detect an electric field produced by the electrode, and
        a third layer made of an of electrically conductive material disposed on an outer surface of the first layer made of an insulating material, wherein the third layer made of electrically conductive material is configured as an electric screen; and
    a mass of dielectric material at least partially enclosing the electrode and the tubular section, wherein the mass of dielectric insulating material fills through openings in the tubular section,
    wherein the first layer made of electrically insulating material includes a first plurality of through openings, each configured as an elongated slit that has a length extending in a direction parallel to the longitudinal axis, and the first plurality of through openings includes a first row of circumferentially spaced through openings and a second row of circumferentially spaced through openings with each through opening of the first row of through openings aligned with a through opening of the second row of through openings in a direction parallel to the longitudinal axis, wherein the second layer made of electrically conductive material includes a second plurality of through openings, each configured as an elongated slit that has a length extending in a direction parallel to the longitudinal axis, and the second plurality of through openings includes a first row of circumferentially spaced through openings and a second row of circumferentially spaced through openings and each through opening of the first row of through openings is aligned with a through opening of the second row of through openings in a direction parallel to the longitudinal axis, wherein the third layer of electrically conductive material includes a third plurality of through openings, each configured as an elongated slit that has a length extending in a direction parallel to the longitudinal axis, and the third plurality of through openings includes a first row of circumferentially spaced through openings and a second row of circumferentially spaced through openings and each through opening of the first row of through openings is aligned with a through opening of the second row of through openings in a direction parallel to the longitudinal axis, wherein each through opening of the second plurality of through openings is aligned with a through opening of the first plurality of through openings, and wherein each through opening of the third plurality of through openings is aligned with a through opening in the first plurality of through openings.

12. The sensor assembly of claim 11, wherein the first layer made of electrically insulating material is a self-supporting lamina.

13. The sensor assembly of claim 11, wherein the tubular section includes a flexible printed circuit board wrapped into a tube shape.

14. A sensor assembly comprising:
an electrode extending along a longitudinal axis;
a tubular body extending along the longitudinal axis and at least partially surrounding the electrode such that the tubular body is radially spaced from the electrode; and
a dielectric material at least partially enclosing the tubular body,
wherein the tubular body comprises
a first section including
an insulating member having an inner surface and an outer surface opposite the inner surface, and
a first electric field sensor comprising a layer of electrically conductive material disposed on the inner surface of the insulating member, the first electric field sensor configured to detect an electric field produced by the electrode,
a first electric screen comprising electrically conductive material surrounding the first section, the first electric screen configured to shield the first electric field sensor from outside electrical interference, and
a second section extending along the longitudinal axis and spaced apart and electrically isolated from the first section and from the first electric screen along the longitudinal axis, the second section comprising electrically conductive material and configured to function as either (i) a second electric screen to shield outside electrical interference independently of the first electric screen, or (ii) a second electric field sensor to detect the electric field produced by the electrode independently of the first electric field sensor.

15. The sensor assembly of claim 14, wherein the second section is configured to function as the second electric field sensor to detect the electric field produced by the electrode.

16. The sensor assembly of claim 14, wherein the layer of electrically conductive material is a first layer of electrically conductive material, and wherein the electrically conductive material of the first electric screen is formed as a second layer of electrically conductive material disposed on an outer surface of the insulating member.

17. The sensor assembly of claim 14, wherein the tubular body includes a flexible printed circuit board.

18. The sensor assembly of claim 14, wherein the first section and the second section are flexible.

19. The sensor assembly of claim 14, wherein the layer of electrically conductive material of the first electric field sensor has a first length extending in a direction parallel to the longitudinal axis, and the first electric screen has a second length extending in a direction parallel to the longitudinal axis, and wherein the first length is less than the second length.

20. The sensor assembly of claim 19, wherein the insulating member has a third length extending in a direction parallel to the longitudinal axis, and wherein the first length is coextensive with the third length.

21. The sensor assembly of claim 14, wherein the second section is electrically isolated from the layer of electrically conductive material disposed on the inner surface of the insulating member.

* * * * *